(12) United States Patent
Matsuda et al.

(10) Patent No.: US 7,904,843 B2
(45) Date of Patent: Mar. 8, 2011

(54) SYSTEMATIC GENERATION OF SCENARIOS FROM SPECIFICATION SHEET

(75) Inventors: Akio Matsuda, Kawasaki (JP); Qiang Zhu, Kawasaki (JP); Ryosuke Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 716 days.

(21) Appl. No.: 11/543,025

(22) Filed: Oct. 5, 2006

(65) Prior Publication Data

US 2007/0261012 A1 Nov. 8, 2007

(30) Foreign Application Priority Data

Mar. 23, 2006 (JP) .................................. 2006-080801

(51) Int. Cl.
*G06F 17/50* (2006.01)
*G06F 9/45* (2006.01)
(52) U.S. Cl. ............ 716/4; 716/1; 716/2; 716/5; 703/13; 703/14; 703/22
(58) Field of Classification Search .................. 716/1, 3, 716/4, 5; 703/1, 6, 7
See application file for complete search history.

(56) References Cited

U.S. PATENT DOCUMENTS

| | | | | |
|---|---|---|---|---|
| 5,249,151 A * | 9/1993 | Chang et al. ....................... 703/7 |
| 5,892,947 A * | 4/1999 | DeLong et al. ................. 717/100 |
| 6,789,054 B1 * | 9/2004 | Makhlouf .......................... 703/6 |
| 7,099,809 B2 * | 8/2006 | Dori .................................. 703/6 |
| 7,107,191 B2 * | 9/2006 | Stewart et al. .................... 703/1 |
| 7,236,965 B2 * | 6/2007 | Iyer ................................. 706/46 |
| 7,260,501 B2 * | 8/2007 | Pattipatti et al. .............. 702/183 |
| 7,275,231 B2 * | 9/2007 | Murthy et al. .................. 716/16 |
| 7,290,193 B2 * | 10/2007 | Kadkade et al. .............. 714/742 |
| 7,536,277 B2 * | 5/2009 | Pattipatti et al. .............. 702/183 |
| 2002/0062296 A1 * | 5/2002 | Nakisa ............................. 706/15 |
| 2003/0046029 A1 * | 3/2003 | Wiener et al. ................. 702/186 |
| 2004/0034543 A1 * | 2/2004 | Bartsch ............................. 705/1 |
| 2007/0050180 A1 * | 3/2007 | Dori .................................. 703/6 |
| 2007/0074180 A1 * | 3/2007 | Hinchey et al. ............... 717/136 |
| 2008/0004840 A1 * | 1/2008 | Pattipatti et al. .............. 702/183 |

FOREIGN PATENT DOCUMENTS

JP 8-235024 9/1996
JP 2002-297412 10/2002

OTHER PUBLICATIONS

Ryosuke Oishi, Qiang Zhu, Tsuneo Nakata, Masataka Mine, Ken'ichiro Kuroki, Yoichi, Endo, Takashi Hasegawa, "A methodology for high-level verification with UML," 2004 Proceedings of DA symposium, Jul. 2004.
Q. Zhu, R. Oishi, T. Hasegawa, T. Nakata, " System-On-Chip Validation using UML and CML," CODES+ISSS 2004, Sep. 2004.
Qiang Zhu et al., "System-On-Chip Verification Process Using UML," <<UML>> 2004, Nov. 2004.
Japanese Office Action mailed on Sep. 29, 2009 and issued in corresponding Japanese Patent Application 2006-080801.

* cited by examiner

*Primary Examiner* — Helen Rossoshek
(74) *Attorney, Agent, or Firm* — Staas & Halsey LLP

(57) ABSTRACT

A method of generating a scenario includes generating a specification model by describing a specification in a predetermined descriptive language, extracting a plurality of operations from the specification model, generating a plurality of operation descriptions, each of which corresponds to one of the operations and includes an operation name and a constraint condition, generating at least one cause-effect graph that combines the operations based on the operation descriptions, and extracting as a scenario a series of operations from the cause-effect graph.

9 Claims, 12 Drawing Sheets

SYSTEMATIC GENERATION OF SCENARIOS FROM SPECIFICATION SHEET

CROSS-REFERENCE TO RELATED APPLICATIONS

The present application is based upon and claims the benefit of priority from the prior Japanese Patent Application No. 2006-080801 filed on Mar. 23, 2006, with the Japanese Patent Office, the entire contents of which are incorporated herein by reference.

BACKGROUND OF THE INVENTION

1. Field of the Invention

The present invention generally relates to computer-aided design, and particularly relates to a scenario generating method, a scenario generating program, and a scenario generating apparatus that generate a scenario for checking the functions of an LSI.

2. Description of the Related Art

Due to the improvement of the integration density of LSI (large scale integrated) circuits, it has become possible to implement a complex system on a single chip as an SOC (System on Chip). In the case of an LSI circuit such as an SOC having large-scale and complex functions, the task to check such functions is cumbersome as it requires a significant amount of time and labor.

In order to check the functions of an LSI, there is a need to exhaustively check all the functions of the LSI specified in its specification sheet. Such a specification sheet describes all the operations of an LSI to be designed, and a series of such operations constitute a scenario. The term "operation" refers to a single action that is obtained by breaking down the specifications. In an example of a recorder LSI, for example, each action such as "recording", "pausing during the recording operation", and "playing" corresponds to a single operation. Further, the term "scenario" refers to a series of operations that makes sense for the purpose of testing the functions of the LSI. The scenario may be regarded as a test program for checking the LSI. In the example of a recorder LSI, a series of actions such as "power-on->recording operation->pause operation" is a scenario for checking a basic recording function of the recorder LSI.

A meaningless arrangement of operations does not make sense as a scenario. In the example of a recorder LSI, a sequence of operations such as "power-off->recording operation" does not make sence. Accordingly, there is a need to extract, from a specification sheet, a scenario as a series of operations with proper meaning for the purpose of testing the function of the LSI. It should be noted that a specification sheet does not describe all the scenarios that should be checked, but describes only part of such scenarios. In a specification sheet of a recorder LSI, for example, a scenario stating, "perform a recording operation for the purpose of recording, and, then, perform a pause operation for the purpose of temporarily suspending the recording," may be described, but a series of operations comprised of "recording operation"->"pause operation"->"pause resetting operation (resuming the recording)" may not be necessarily described as a single, complete scenario.

Accordingly, in order to exhaustively check all the functions of the LSI, there is a need to extract not only the scenarios expressly described in the specification sheet but also the scenarios that are not expressly described in the specification sheet but can be composed by combining individual operations described in the specification sheet. Namely, not only the scenarios expressly described in the specification sheet need to be extracted, but also scenarios that are not directly described in the specification sheet need to be generated.

Specification sheets are written in natural languages such as Japanese, English, etc. Accordingly, it is desired to devise a method that can convert the contents of a specification sheet into a predetermined notation treatable by a computer, and that can then generate all the scenarios systematically from such a notation.

[Non Patent Document 1]
Ryosuke Oishi, Qiang Zhu, Tsuneo Nakata, Masataka Mine, Ken'ichiro Kuroki, Yoichi Endo, Takashi Hasegawa, "A methodology for high-level verification with UML," 2004 Proceedings of DA symposium, July, 2004

[Non Patent Document 2]
Q. Zhu, R. Oishi, T. Hasegawa, T. Nakata, "System-On-Chip Validation using UML and CML," CODES+ISSS 2004, September, 2004

[Non Patent Document 3]
Q. Zhu, R. Oishi, T. Hasegawa, T. Nakata, "System-On-Chip Validation using UML and CML," CODES+ISSS 2004, September, 2004

Accordingly, there is a need for a method that can systematically generate all the scenarios from a specification sheet in order to exhaustively check the functions of the LSI.

SUMMARY OF THE INVENTION

It is a general object of the present invention to provide a scenario generating method, a scenario generating program, and a scenario generating apparatus that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a scenario generating method, a scenario generating program, and a scenario generating apparatus particularly pointed out in the specification in such full, clear, concise, and exact terms as to enable a person having ordinary skill in the art to practice the invention.

To achieve these and other advantages in accordance with the purpose of the invention, the invention provides a method of generating a scenario, which includes generating a specification model by describing a specification in a predetermined descriptive language, extracting a plurality of operations from the specification model, generating a plurality of operation descriptions, each of which corresponds to one of the operations and includes an operation name and a constraint condition, generating at least one cause-effect graph that combines the operations based on the operation descriptions, and extracting as a scenario a series of operations from the cause-effect graph.

According to another aspect of the present invention, a record medium having a program embodied therein for causing a computer to generate a scenario is provided such that the program causes the computer to perform the steps of extracting a plurality of operations from a specification model that is written in a predetermined descriptive language, generating a plurality of operation descriptions, each of which corresponds to one of the operations and includes an operation name and a constraint condition, generating at least one cause-effect graph that combines the operations based on the operation descriptions, and extracting as a scenario a series of operations from the cause-effect graph.

According to another aspect of the present invention, an apparatus for generating a scenario includes a memory configured to store a program and a specification model that is written in a predetermined descriptive language, and a processing unit configured to process the specification model stored in the memory by executing the program stored in the memory, wherein the processing unit performs extracting a plurality of operations from the specification model, generating a plurality of operation descriptions, each of which corresponds to one of the operations and includes an operation name and a constraint condition, generating at least one cause-effect graph that combines the operations based on the operation descriptions, and extracting as a scenario a series of operations from the cause-effect graph.

According to at least one embedment of the present invention, a plurality of operations extracted from a specification sheet are merged by use of such a combination as to make sense, thereby generating cause-effect graphs that include scenarios that make sense. Since each operation description defines its input-output relationships under given constraint conditions, this input-output relationships make sense as a part of a scenario. Accordingly, a cause-effect graph generated by combining a plurality of operations according to the operation descriptions also has the cause-effect relationships thereof being true under the conditions that satisfy the constraint conditions, and, thus, makes sense as a scenario. Scenarios are automatically generated in a systematic manner from the specification sheet, thereby making it possible to extract all the scenarios.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the present invention, a UML (Unified Modeling Language) is used to extract individual operations from a specification sheet that is written in a natural language such as Japanese or English. The UML is a language that has been developed as a unified notation for representing a system by use of a model in object-oriented system design. The UML defines various diagrams for drawing system blueprints, and these diagrams serve as the unified language (notation).

First, modeling is performed based on a specification sheet by use of the UML so as to extract the names of individual operations and constraint conditions for these operations from the UML model. A relational expression of operation descriptions is then generated based on the operation descriptions that include the names of the individual operations and the constraint conditions for these operations extracted as described above. Here, a relational expression of operation description is a logic expression that describes, by use of a predicate logic, the relationships between the inputs and output of a given operation. An example of such relational expression of operation description is "if a given operation is performed under a given precondition, a certain output is obtained under a certain constraint."

Next, based on the relational expressions of operation description that are generated in one-to-one correspondence to operations, cause-effect graphs are generated in one-to-one correspondence to the relational expressions of operation description. The cause-effect graph is a directed graph that represents the relationships between the cause and effect such as "if a given operation is performed under a given precondition, a certain output is obtained under a certain constraint." A plurality of directed graphs are then combined to generate a combined cause-effect graph. This combined cause-effect graph is a graph that represents the relationships between the cause and effect linked across multiple operations such as "if a first operation is performed under a given precondition, a first output is obtained under a certain constraint, and if a second operation is performed with the first output serving as a precondition, a second output is obtained." All the possible (meaningful) combinations are generated with respect to all the operations extracted from the specification sheet, thereby creating a set of cause-effect graphs that include all the scenarios. Finally, a series of operations that brings about a desired outcome is extracted from the set of cause-effect graphs in order to obtain a desired check scenario (i.e., the scenario that brings about a desired outcome). In this manner, a desired check scenario is obtained.

In the following, embodiments of the present invention will be described with reference to the accompanying drawings.

Figure 1:
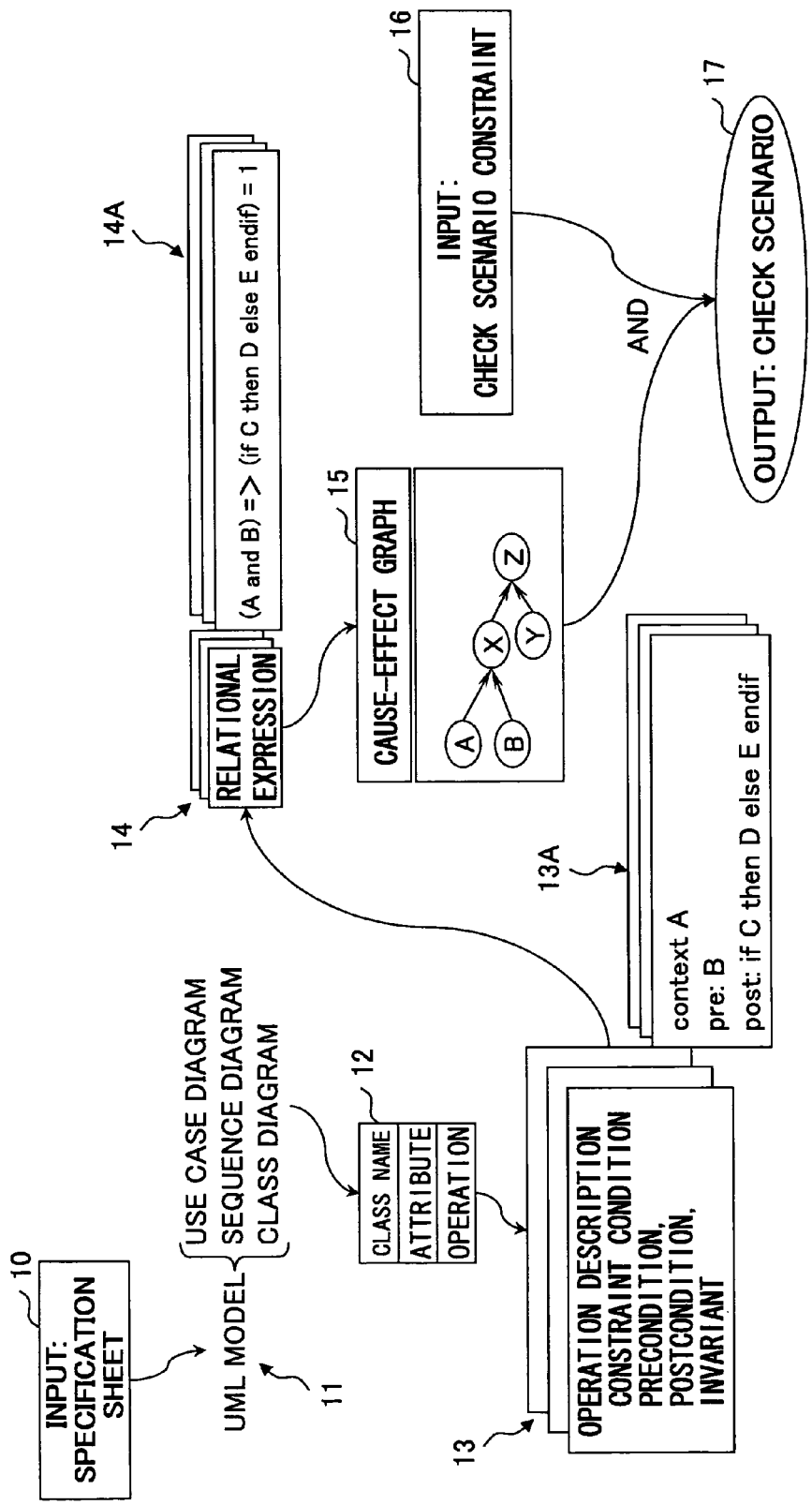
FIG. 1 is a drawing showing the outline of an embodiment of a scenario generating method according to the present invention.

FIG. 1 is a drawing showing the outline of an embodiment of a scenario generating method according to the present invention. In FIG. 1, a specification sheet 10 of the LSI to be checked is provided as an input. The specification sheet 10 is written in natural language such as Japanese or English, and defines the functions, configurations, and the like of the LSI to be checked. The specification sheet 10 describes the requirements that must be satisfied by the LSI when it is completed as a product.

Based on the specification sheet 10, a UML model 11 is generated. In the UML, three types of structure diagrams, five types of behavior diagrams, and two types of implementation diagrams are provided. With these diagrams, the system to be designed can be modeled. In general, there are three important diagram types. That is, the class diagram of the structure diagrams and the sequence diagram and use case diagram of the behavior diagrams are mainly used. The use case diagram displays, as components, a system that provides functions, the functions provided by the system, and external entities and/or the like that use the system, thereby representing the behavior the system as viewed from the exterior. The class diagram serves to model the system as a set of classes and the relationships between the classes serving as the constituent elements of the system. The sequence diagram represents message transmissions between objects in a time sequence, thereby defining the dynamic behavior of the system that describes how the classes operate in association with each other. The task to extract the use case diagram, the class diagram, the sequence diagram, and the like from the specification sheet written in natural language is performed by hand.

As shown in FIG. 1, a class diagram 12 generally includes a class name, an attribute, and an operation. The top box area of the class diagram 12 is referred to as a name compartment, which shows the name of the class and the type of the class. The middle box area is referred to as an attribute compartment, which includes a list of attributes of the class. The bottom box area is referred to as an operation compartment, which lists operations.

Individual operations are extracted from the class diagrams 12 generated as described above, thereby generating a plurality of operation descriptions 13. Each of the operation descriptions 13 corresponds to a single operation. One operation description 13 includes the name of the operation and the constraint conditions thereof. The constraint conditions include a precondition, a postcondition, and an invariant.

The precondition is the condition that needs to be satisfied when the operation starts. In the case of a recorder LSI, for example, the fact that there is an available memory space may be required as a precondition in order to perform a recording operation. The post condition is the condition that is supposed to be satisfied when the operation comes to an end. When a recording operation is performed, for example, the fact that audio data starts to be stored in memory may be achieved as a postcondition. The invariant is the condition that needs to be satisfied and does not vary during the ongoing operation. For example, the fact that power must be kept on during a recording operation may be required as an invariant.

In the UML, no particular language or notation is designated for the purpose of expressing the constraint conditions. Accordingly, the constraint conditions regarding operations extracted by use of the UML may be written in natural language, may alternatively be written in the OCL (Object Constraint Language). The OCL is a formal language for use in describing a model, and can define, as an expression, the propositions that need to be satisfied between model elements and relationships. In the present invention, it is preferable to describe the constraint conditions by use of the OCL as shown in FIG. 1 as an operation description example 13A.

In the operation description example 13A shown in FIG. 1, "context A" indicates that what is shown here is the constraint conditions for an operation A. Further, "pre: B" indicates that a precondition B is required. Moreover, "post: if C then D else E endif" indicates that a state D occurs if a constraint C is true, and a state E occurs otherwise. In the example of a recorder LSI, the postcondition may be such that if the constraint "no available memory space" is true, then, the state "recording suspended halfway through" occurs, and the state "continued recording being possible" occurs otherwise.

Then, based on the operation descriptions 13 provided in one-to-one correspondence to a plurality of operations, a plurality of operation-description relational expressions 14 are generated in one-to-one correspondence to the plurality of operations. Here, an operation-description relational expression is a logic expression that describes, by use of a predicate logic, the relationships between the inputs and output of a given operation. An example of such relational expression of operation description is "if a given operation is performed under a given precondition, a certain output is obtained under a certain constraint." In an operation-description relational expression example 14A shown in FIG. 1, "(A and B)" indicates that A and B are satisfied, i.e., indicates the fact the operation A is performed under the precondition B. The rest of the description indicates that, as a result ("=>"), the proposition "(if C then D else E endif)" becomes true. Namely, when the operation A is performed under the precondition B, the state D occurs if the constraint C is true, and the state E occurs otherwise.

The task to generate the operation-description relational expressions 14 for the respective operations may be performed automatically (mechanically). Namely, a computer analyzes and processes the operation descriptions 13 to automatically generate the operation-description relational expressions 14. For the purpose of such automatic generation, however, the constraint conditions are required to be written in the OCL or the like. If the constraint conditions are written in natural language, there is a need to convert such constraint conditions into the OCL or the like in advance.

Next, based on the operation-description relational expressions 14 that are generated in one-to-one correspondence to operations, cause-effect graphs 15 are generated in one-to-one correspondence to the relational expressions of operation description. The cause-effect graph 15 is a directed graph that represents the relationships between the cause and effect such as "if a given operation is performed under a given precondition, a certain output is obtained under a certain constraint."

A plurality of cause-effect graphs 15 are then combined together to generate a combined cause-effect graph 15. For example, a cause-effect graph 15 expressing "if a first operation is performed under a given precondition, a first output is obtained under a certain constraint" and a cause-effect graph 15 expressing "if a second operation is performed with the first output serving as a precondition, a second output is obtained" have the "first output" as a common constituent element. Based on this, it is found that these cause-effect graphs 15 can be combined. These two cause-effect graphs 15 are thus combined to generate a graph that represents the relationships between the cause and effect linked across multiple operations such as "if a first operation is performed under a given precondition, a first output is obtained under a certain constraint, and if a second operation is performed with the first output serving as a precondition, a second output is obtained." If expressed as a visually presented diagram, the cause-effect graph 15 may be expressed as being comprised of nodes and arrows as shown in FIG. 1.

The tasks to generate the cause-effect graphs 15 from the operation-description relational expressions 14 and further to combine the cause-effect graphs 15 may be performed automatically (mechanically) by a computer. Specifically, a given node (e.g., the precondition) of a given cause-effect graph 15 may be selected as a node of interest, and a search is performed with respect to all the other cause-effect graphs 15 to check whether this given node appears in these other cause-effect graphs 15. If one or more cause-effect graphs 15 are found to include this given node, these one or more cause-effect graphs 15 may be combined with the given cause-effect graph 15. In so doing, there are 6 patterns as to the types of combinations, as will later be described. A next node is selected successively as a new node of interest, and a next cause-effect graph is selected successively as a new cause-effect graph of interest, thereby generating a set of the cause-effect graphs 15 that include all the combinations of all the operations. The set of the cause-effect graphs 15 that are obtained at the end may include one or more cause-effect graphs 15 that have the size of a minimum unit corresponding to a single operation.

In this manner, all the possible (meaningful) combinations are generated with respect to all the operation-description relational expressions 14 corresponding to all the operations extracted from the specification sheet, thereby creating a set of cause-effect graphs 15 that include all the scenarios. Here, a cause-effect graph 15 corresponding to an operation-description relational expression 14 defines its input-output relationships under given constraint conditions, so that this input-output relationships make sense as a part of a scenario. Accordingly, a cause-effect graph 15 generated by combining a plurality of cause-effect graphs 15 also has the cause-effect relationships thereof being true under the conditions that satisfy the constraint conditions, and, thus, makes sense as a scenario.

Finally, a check scenario constraint 16 is entered in order to obtain a desired check scenario (i.e., the scenario that brings about a desired outcome). The check scenario constraint 16 expresses a desired outcome. A series of operations that lead to the check scenario constraint 16 is searched in and extracted from the set of cause-effect graphs 15, thereby providing a desired check scenario 17.

In the example of a recorder LSI, the check scenario constraint 16 may be "recorded data excluding an unnecessary part in the middle". A cause-effect graph 15 that causes the state "recorded data excluding an unnecessary part in the middle" to be true is searched for and extracted, thereby providing a check scenario such as "perform a recording operation, perform a pause operation, reset the pause operation, and perform a recording stop operation".

Figure 2:
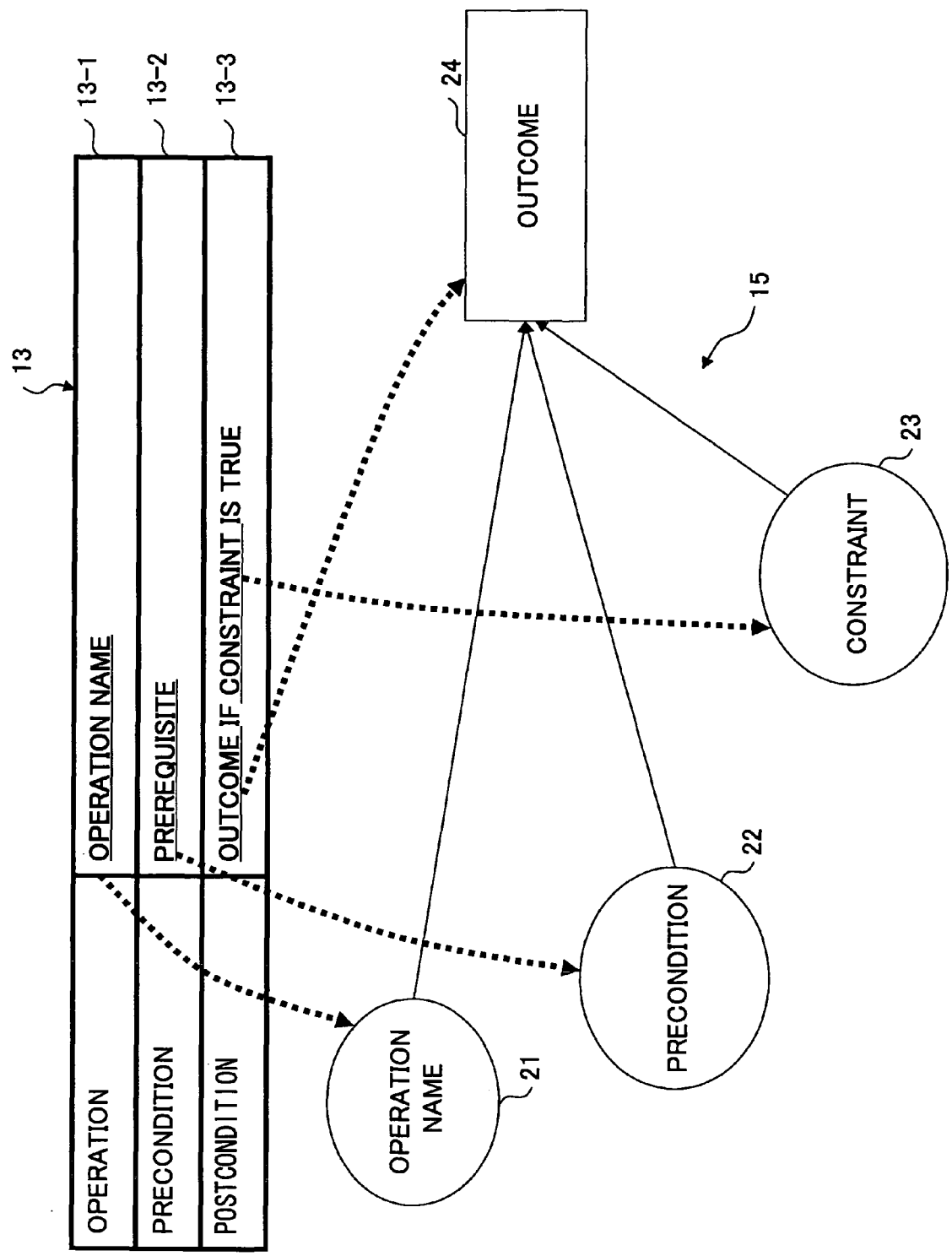
FIG. 2 is a drawing showing the relationship between an operation description and a cause-effect graph.

FIG. 2 is a drawing showing the relationship between an operation description 13 and a cause-effect graph 15. FIG. 2 illustrates an operation description 13 regarding a certain operation, and also illustrates a cause-effect graph 15 corresponding to such an operation description 13. The operation description 13 includes an operation 13-1, a precondition 13-2, and a postcondition 13-3, for example. The operation 13-1 specifies the name of the operation. The precondition 13-2 specifies a postcondition, and the precondition 13-2 specifies a constraint and an outcome.

The name of the operation specified in the operation 13-1 appears as an operation name 21 serving as a constituent element of the cause-effect graph 15. The precondition specified in the precondition 13-2 appears as a precondition 22 serving as a constituent element of the cause-effect graph 15. The constraint and outcome specified in the postcondition 13-3 appear as a constraint 23 and outcome 24 serving as constituent elements of the cause-effect graph 15. As shown in FIG. 2, arrows showing directions from the inputs (operation name, precondition, constraint) to the output (outcome) connect between these constituent elements (nodes). In this manner, an operation description 13 (or operation-description relational expression 14) can be represented as a cause-effect graph 15. FIG. 3 through FIG. 8 are drawings showing the six combinations that appear when combining the operation-description relational expressions 14.

Figure 3:
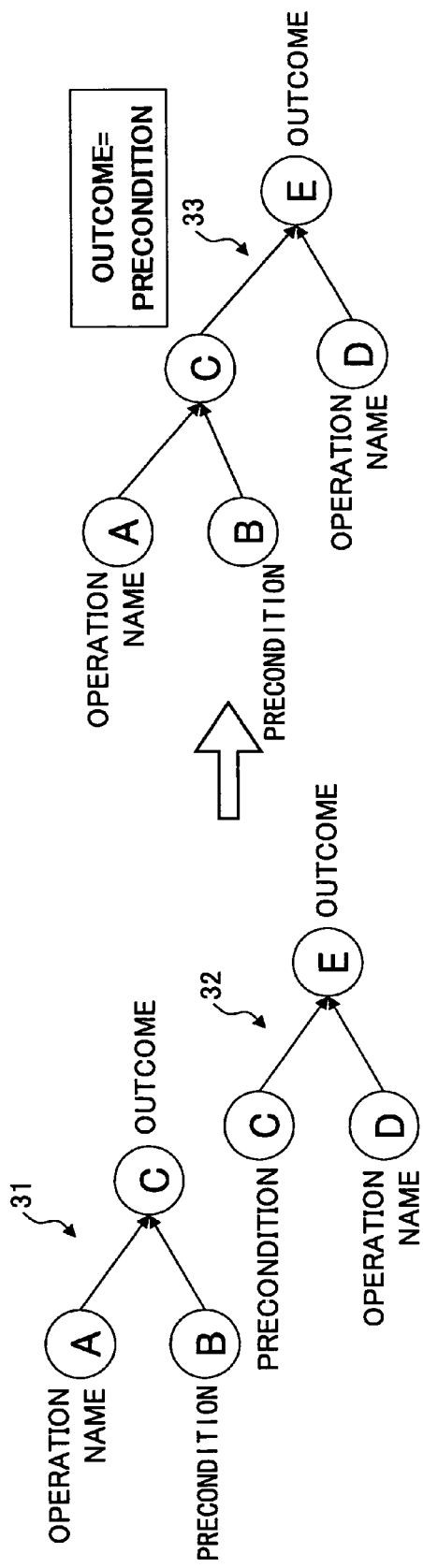
FIG. 3 is a drawing showing a first combination that appears when combining the operation-description relational expressions.

In FIG. 3, a first operation 31 is represented as having an operation name A, a precondition B, and an outcome C. Further, a second operation 32 is represented as having an operation name D, a precondition C, and an outcome E. In this case, the outcome C of the first operation 31 and the precondition C of the second operation 32 are both "C" and thus match. Here, the term "match" means that the contents of two or more nodes are identical in substance regardless of whether the categories of these two or more nodes are operation names, preconditions, constraints, or outcomes.

Accordingly, the outcome C of the first operation 31 and the precondition C of the second operation 32 are merged into one node, thereby generating a combined cause-effect graph 33. The combined cause-effect graph 33 signifies the fact that if the operation of the operation name A is performed under the precondition B, the outcome C is obtained, and, further, if the operation of the operation name D is performed under the precondition being the outcome C, the outcome E is obtained.

Figure 4:
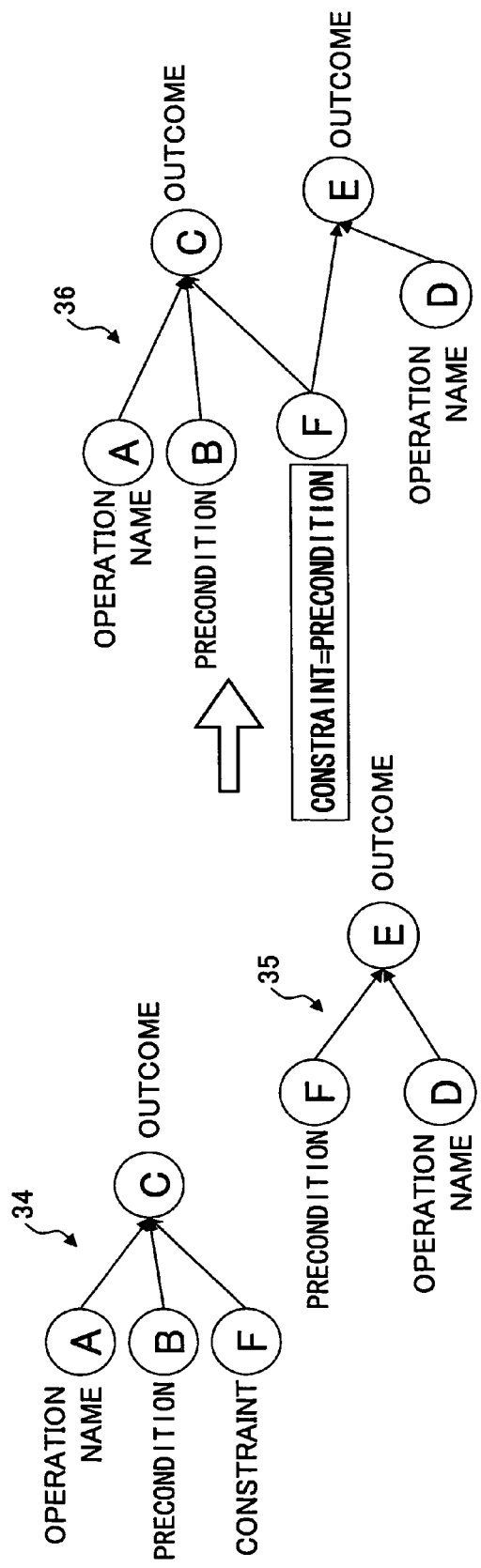
FIG. 4 is a drawing showing a second combination that appears when combining the operation-description relational expressions.

In FIG. 4, a first operation 34 is represented as having an operation name A, a precondition B, a constraint F, and an outcome C. Further, a second operation 35 is represented as having an operation name D, a precondition F, and an outcome E. In this case, the constraint F of the first operation 34 and the precondition F of the second operation 35 are both "F" and thus match.

Accordingly, the constraint F of the first operation 34 and the precondition F of the second operation 35 are merged into one node, thereby generating a combined cause-effect graph 36. The combined cause-effect graph 36 signifies the fact that upon performing the operation of the operation name A under the precondition B, the outcome C is obtained if the constraint F is true, and, further, upon performing the operation of the operation name D under the precondition F, the outcome E is obtained.

Figure 5:
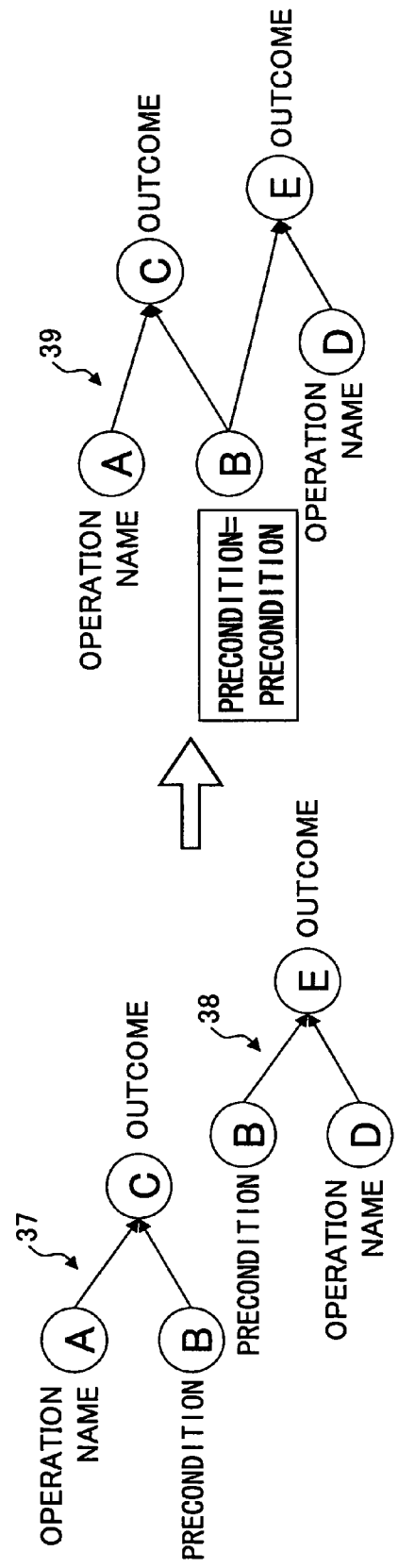
FIG. 5 is a drawing showing a third combination that appears when combining the operation-description relational expressions.

In FIG. 5, a first operation 37 is represented as having an operation name A, a precondition B, and an outcome C. Further, a second operation 38 is represented as having an operation name D, a precondition B, and an outcome E. In this case, the precondition B of the first operation 37 and the precondition B of the second operation 38 are both "B" and thus match.

Accordingly, the precondition B of the first operation 37 and the precondition B of the second operation 38 are merged into one node, thereby generating a combined cause-effect graph 39. The combined cause-effect graph 39 signifies the fact that if the operation of the operation name A is performed under the precondition B, the outcome C is obtained, and, further, if the operation of the operation name D is performed under the precondition B, the outcome E is obtained.

Figure 6:
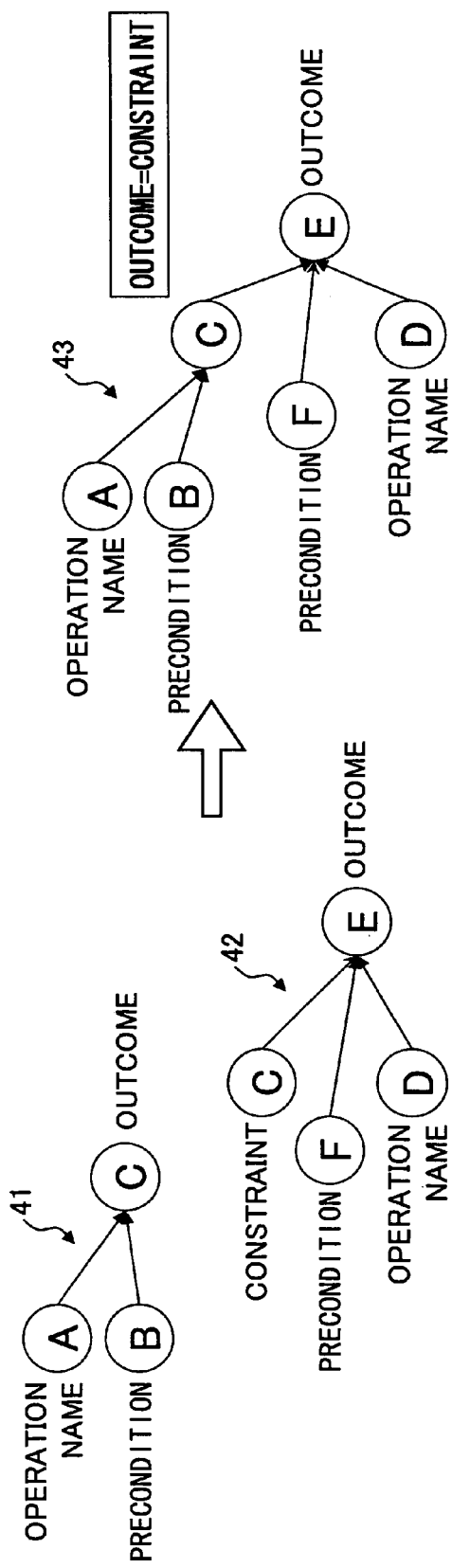
FIG. 6 is a drawing showing a fourth combination that appears when combining the operation-description relational expressions.

In FIG. 6, a first operation 41 is represented as having an operation name A, a precondition B, and an outcome C. Further, a second operation 42 is represented as having an operation name D, a precondition F, a constraint C, and an outcome E. In this case, the outcome C of the first operation 41 and the constraint C of the second operation 42 are both "C" and thus match.

Accordingly, the outcome C of the first operation 41 and the constraint C of the second operation 42 are merged into one node, thereby generating a combined cause-effect graph 43. The combined cause-effect graph 43 signifies the fact that upon performing the operation of the operation name A under the precondition B, the outcome C is obtained, and, further, upon performing the operation of the operation name D under the precondition F, the outcome E is obtained if the outcome C serving as a constraint is true.

Figure 7:
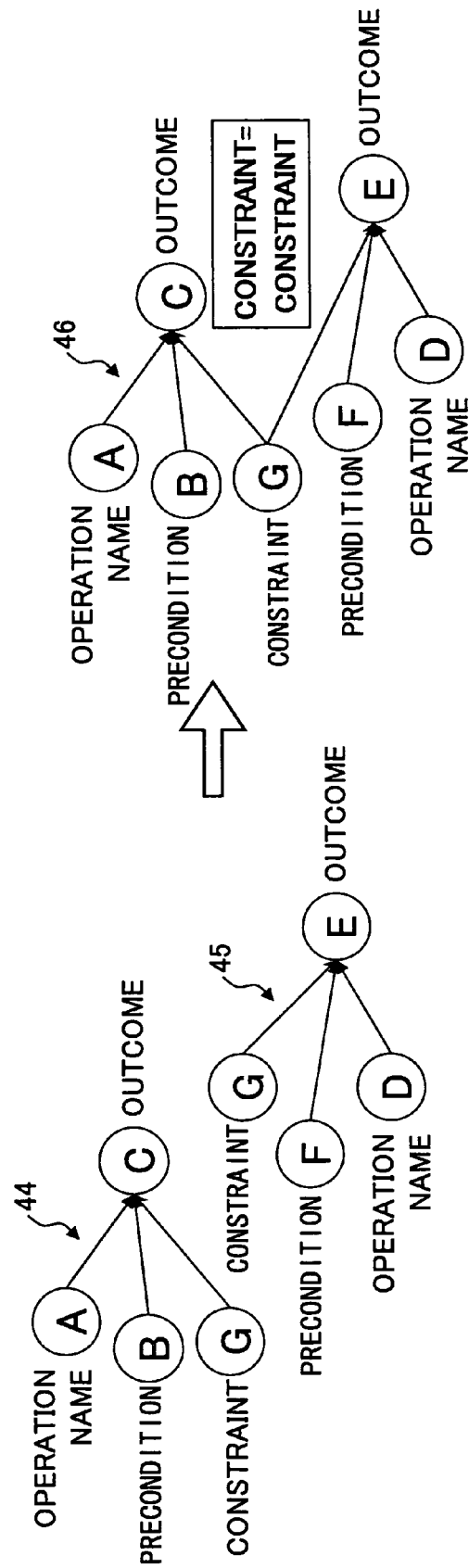
FIG. 7 is a drawing showing a fifth combination that appears when combining the operation-description relational expressions.

In FIG. 7, a first operation 44 is represented as having an operation name A, a precondition B, a constraint G, and an outcome C. Further, a second operation 45 is represented as having an operation name D, a precondition F, a constraint G, and an outcome E. In this case, the constraint G of the first operation 44 and the constraint G of the second operation 42 are both "G" and thus match.

Accordingly, the constraint G of the first operation 44 and the constraint G of the second operation 45 are merged into one node, thereby generating a combined cause-effect graph 46. The combined cause-effect graph 46 signifies the fact that upon performing the operation of the operation name A under the precondition B, the outcome C is obtained if the constraint G is true, and, further, upon performing the operation of the operation name D under the precondition F, the outcome E is obtained if the constraint G is true.

Figure 8:
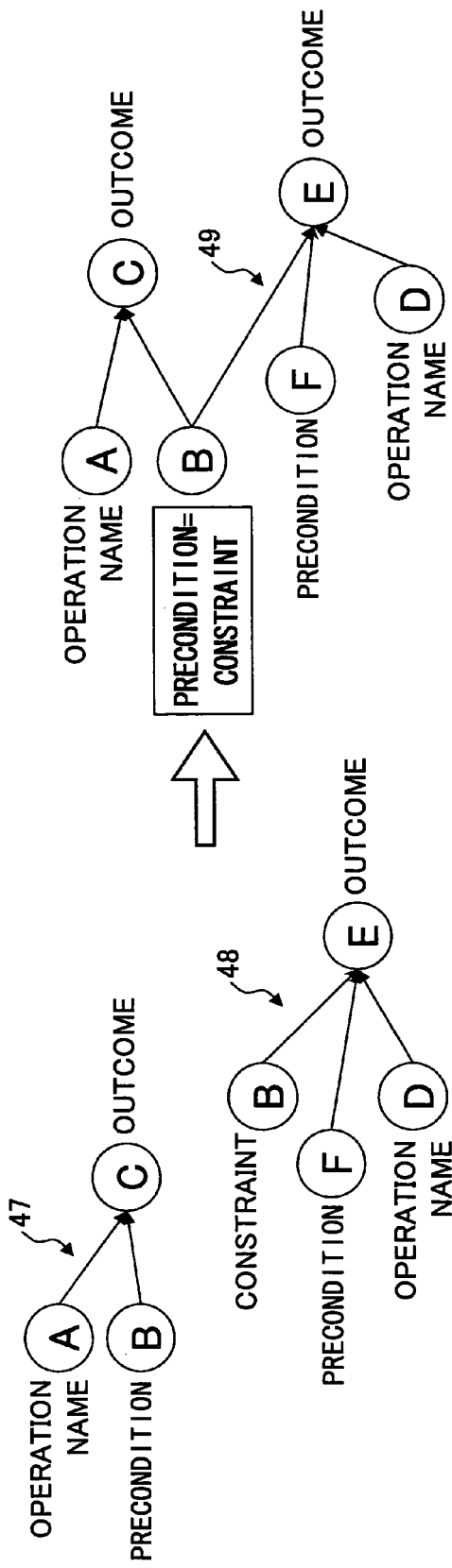
FIG. 8 is a drawing showing a sixth combination that appears when combining the operation-description relational expressions.

In FIG. 8, a first operation 47 is represented as having an operation name A, a precondition B, and an outcome C. Further, a second operation 48 is represented as having an operation name D, a precondition F, a constraint B, and an outcome E. In this case, the precondition B of the first operation 47 and the constraint B of the second operation 48 are both "B" and thus match.

Accordingly, the precondition B of the first operation 47 and the constraint B of the second operation 48 are merged into one node, thereby generating a combined cause-effect graph 49. The combined cause-effect graph 49 signifies the fact that upon performing the operation of the operation name A under the precondition B, the outcome C is obtained, and, further, upon performing the operation of the operation name D under the precondition F, the outcome E is obtained if the precondition B serving as a constraint is true.

When a larger cause-effect graph 15 is generated by combining two cause-effect graphs 15, there are only six patterns shown in FIG. 3 through FIG. 8. As a larger cause-effect graph 15 is generated by combining cause-effect graphs 15 according to these six patterns, a set of cause-effect graphs 15 is created that corresponds to a scenario that makes sense.

Figure 9:
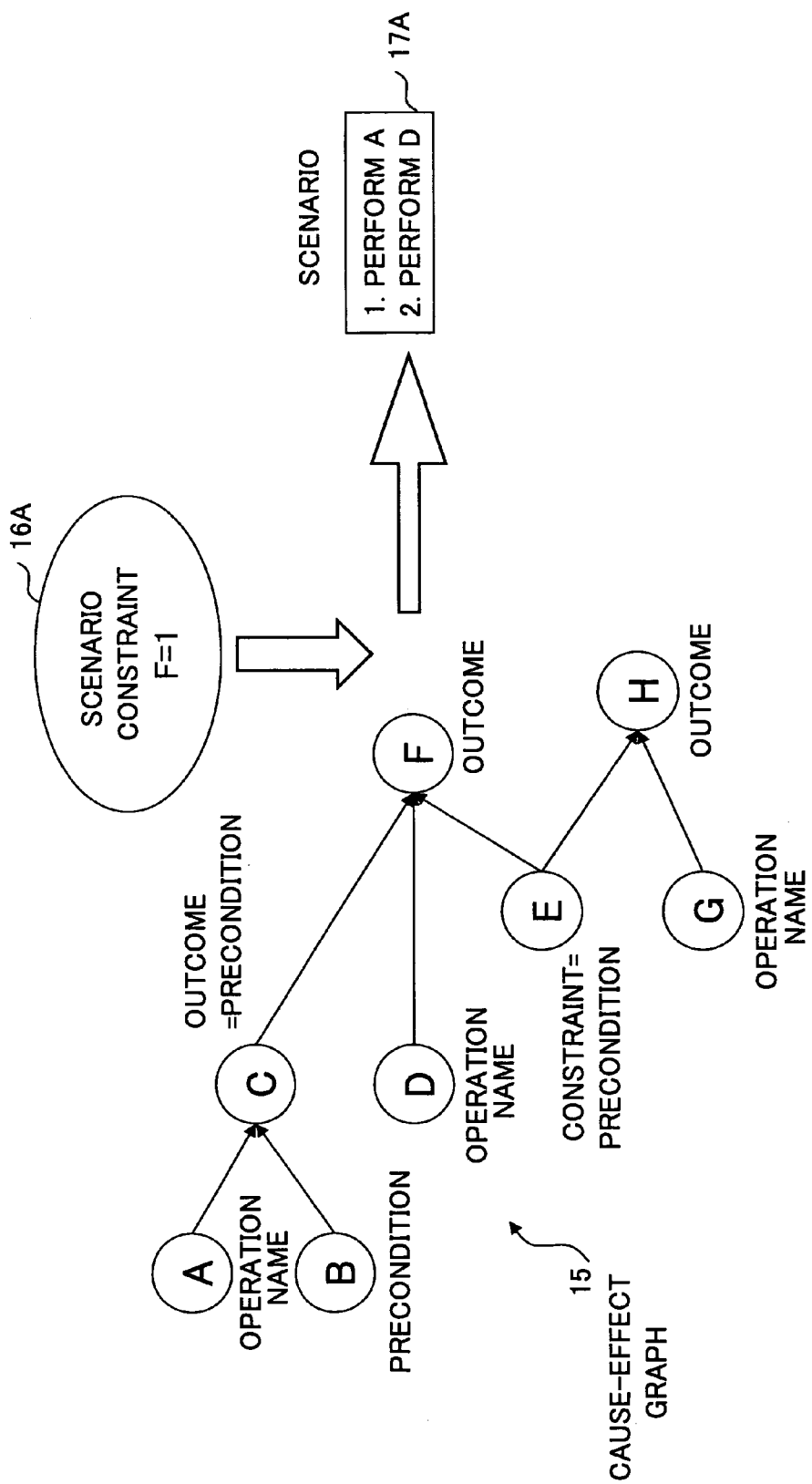
FIG. 9 is a drawing for explaining the extraction of a scenario from a cause-effect graph.

FIG. 9 is a drawing for explaining the extraction of a scenario from a cause-effect graph. In an example shown in FIG. 9, the cause-effect graph 15 includes an operation A, a precondition B, an outcome and precondition C, an operation D, a constraint and precondition E, an outcome F, an operation G, and an outcome H. In the state in which such a cause-effect graph 15 is already obtained, a scenario constraint 16A is specified.

The scenario constraint 16A requires that the outcome F be true (=1). A scenario that makes the outcome F true is thus generated according to this request. In this example, a series of operations specifying that the operation A is performed first, and, then, the operation D is performed is extracted as a desired check scenario 17A.

Figure 10:
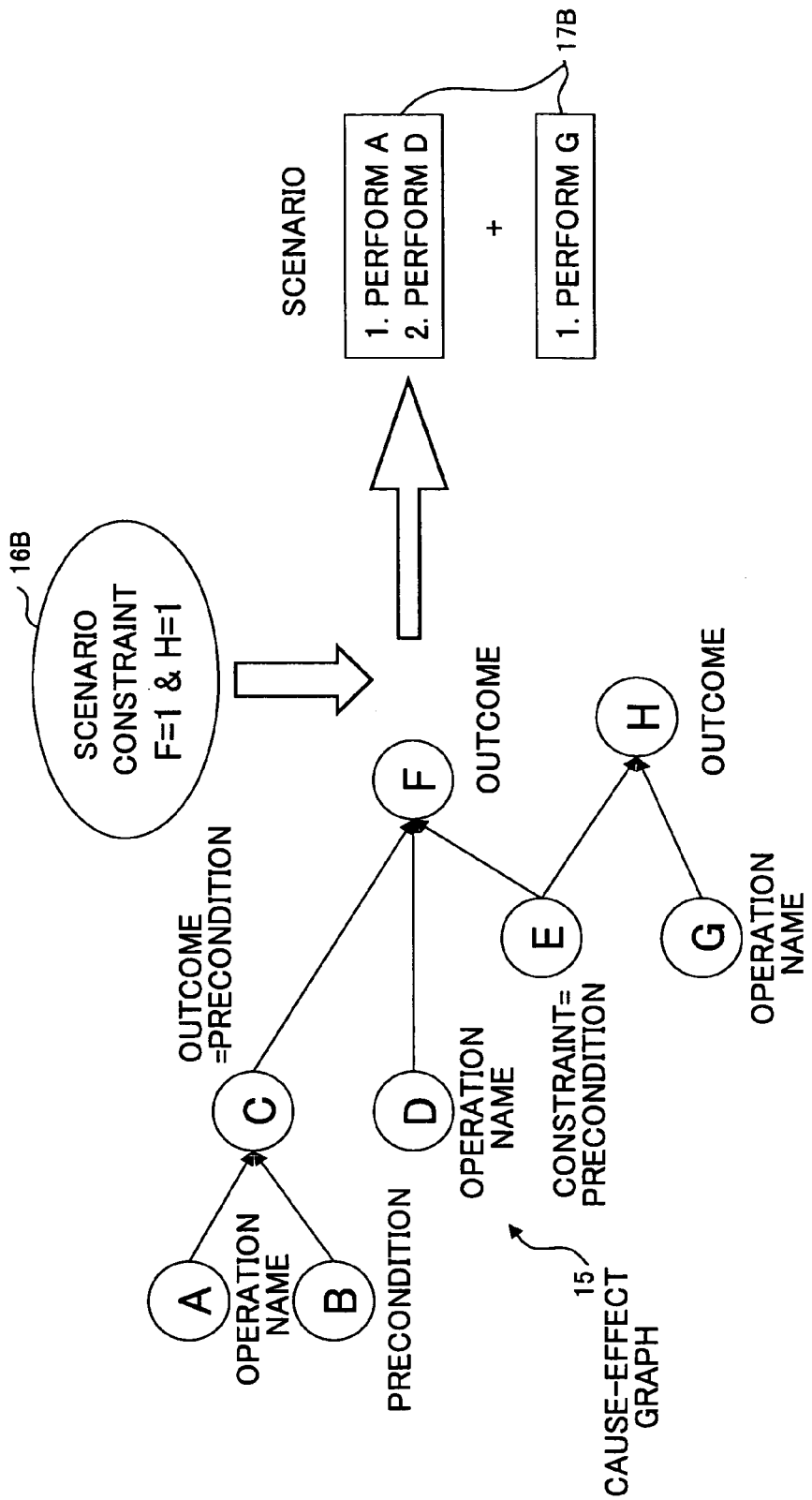
FIG. 10 is a drawing for explaining the extraction of a scenario from a cause-effect graph.

FIG. 10 is a drawing for explaining the extraction of a scenario from a cause-effect graph. In an example shown in FIG. 10, the cause-effect graph 15 includes an operation A, a precondition B, an outcome and precondition C, an operation D, a constraint and precondition E, an outcome F, an operation G, and an outcome H. In the state in which such a cause-effect graph 15 is already obtained, a scenario constraint 16B is specified.

The scenario constraint 16B requires that the outcome F be true (=1) and that the outcome H be true (=1). A scenario that makes the outcome F true and also makes the outcome H true is thus generated according to this request. In this example, a series of operations specifying that the operation A is performed first, and, then, the operation D is performed, together with an operation specifying that the operation G is performed, are extracted as a desired check scenario 17B. In FIG. 10, the operation G of the desired check scenario 17B is illustrated as being independent of the series of operations comprised of the operation A and the operation D. This is because there is no requirement as to the temporal order between the operation G and the operations A and D. Namely, the operation G may be performed at any timing independently of the operations A and D. The operation D, on the other hand, needs to be performed after the operation A. This is because the operation D needs to be performed under the precondition that is the outcome C of the operation A.

The extraction of a check scenario as shown in FIG. 9 or FIG. 10 may be performed by following nodes on the cause-effect graph 15 from the node that indicates the condition required by the scenario constraint (e.g., the condition that the outcome F be true). With such strategy, it can be found that the operation D needs to be performed under the precondition C in order to obtain the outcome F, and the operation A needs to be performed in order to satisfy the precondition C. In this manner, the scenario specifying that the operation A is performed first and the operation D is performed next is obtained.

For the extraction of such a check scenario, a Binary Decision Diagram (BDD) may be utilized. BDD makes it possible to quickly determine whether a logic function is satisfiable. Further, if the logic function is satisfiable, BDD can obtain input values achieving the value "1" of the logic function. Accordingly, if the cause-effect graph 15 is represented by BDD, the task to extract a check scenario becomes equivalent to the problem of determining satisfiability according to BDD, and can thus be performed automatically (mechanically) by a computer.

Figure 11:
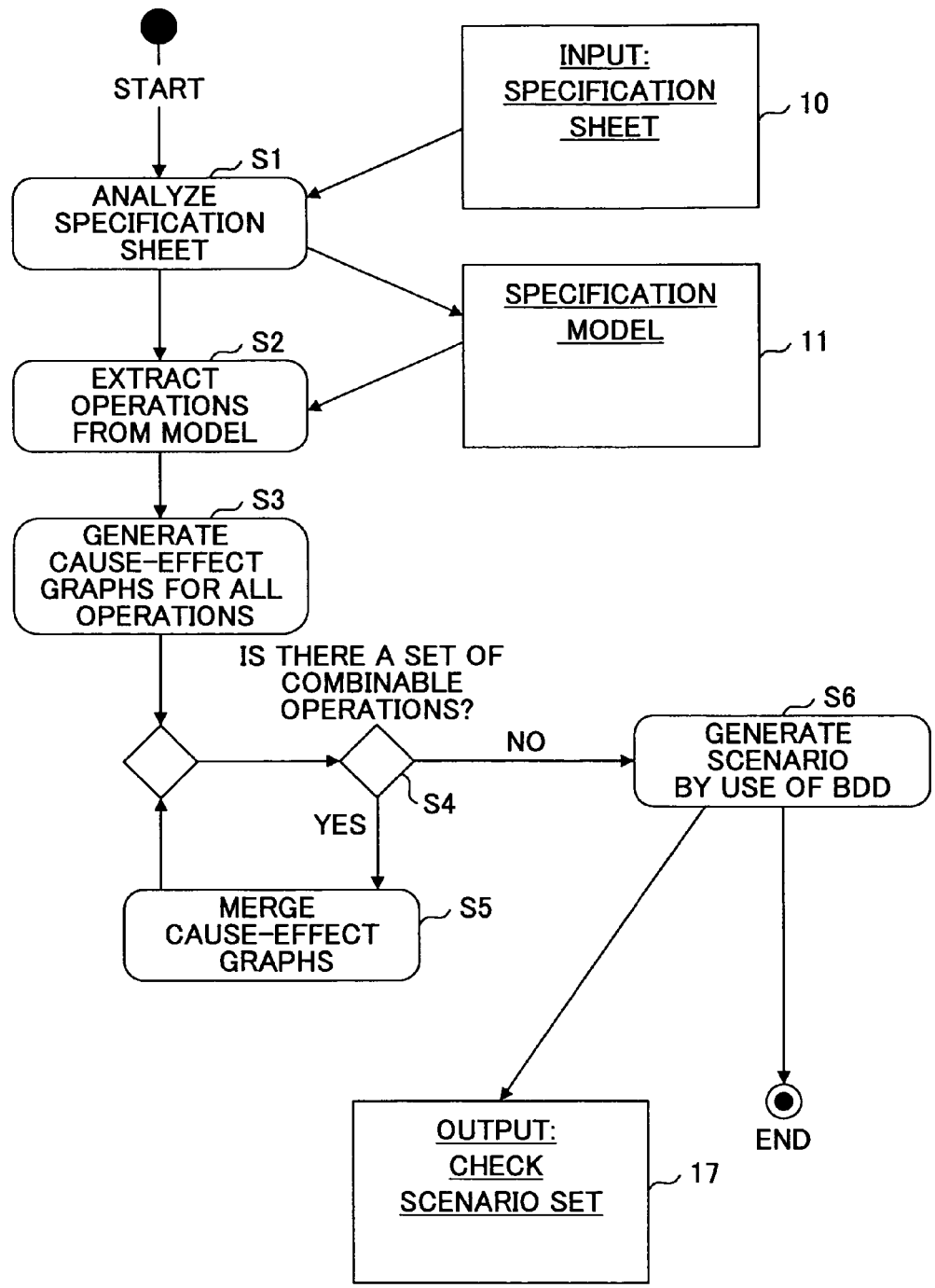
FIG. 11 is a drawing showing the procedure of the scenario generating method according to the present invention.

FIG. 11 is a drawing showing the procedure of the scenario generating method according to the present invention. At step S1, the specification sheet 10 is analyzed. As previously described, the specification sheet 10 is written in natural language. The specification sheet 10 is analyzed to generate the specification model 11 that is written in a systematic specification description language such as a UML. This is performed by hand. The next step and onwards will be performed automatically by a computer.

At step S2, operations are extracted from the specification model 11. As previously described, an operation description includes the name of the operation and the constraint conditions thereof. Operation descriptions are written in a predetermined descriptive language (e.g., OCL).

At step S3, cause-effect graphs are generated with respect to all the operations. Specifically, the cause-effect graphs are generated from the operation descriptions by use of operation-description relational expressions as intermediaries.

At step S4, a check is made as to whether there is a combinable set of operations among multiple cause-effect graphs. If the check indicates "yes", the cause-effect graphs corresponding to the combinable operations are merged at step S5. There are only six patterns shown in FIG. 3 through FIG. 8 in terms of the way to combine the graphs. Thereafter, the procedure returns to step S4, and the check for combinability and the merging of graphs are repeated.

If the check for combinability at step S4 indicates "no" (indicating that there is no set of combinable cause-effect graphs), the procedure proceeds to step S6. At step S6, a scenario is generated by use of the Binary Decision Diagram method. Namely, as was described by referring to FIG. 9 and FIG. 10, a series of operations that constitute a check scenario are extracted by specifying such input values into the cause-effect graphs as to make true the check scenario constraint. A series of operations is extracted from the cause-effect graphs separately for each of all the desired check scenario constraints, thereby generating a check scenario set 17.

In the description provided above, the merging of multiple operations is performed by merging a plurality of cause-effect graphs. It should be noted that the merging of multiple operations does not have to be performed with respect to cause-effect graphs, and may possibly be performed with respect to operation descriptions or with respect to operation-description relational expressions.

When the check scenario set 17 is obtained in this manner, each check scenario is used to check the functions of the LSI to be tested. If the check is to be performed after the implementation of the LSI, each check scenario may be written to the host computer for controlling an LSI tester, which may then be used to operate the target LSI in the manner as specified in the check scenario, thereby testing whether the LSI operates as expected, i.e., whether the functions of the LSI are proper.

Figure 12:
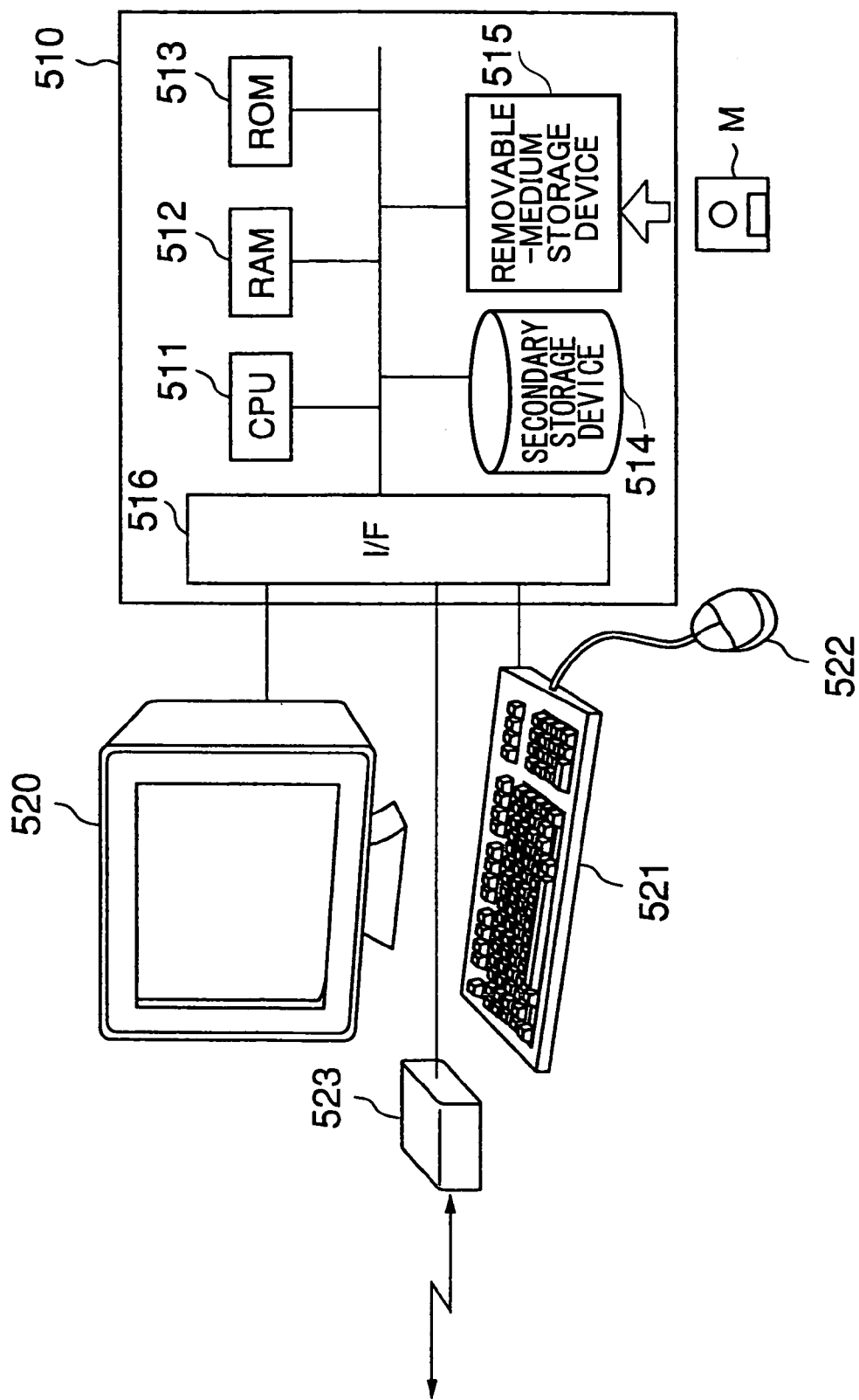
FIG. 12 is a drawing showing the configuration of an apparatus for performing the scenario generating method according to the present invention.

FIG. 12 is a drawing showing the configuration of an apparatus for performing the scenario generating method according to the present invention.

As shown in FIG. 12, the apparatus for performing the scenario generating method according to the present invention is implemented as a computer such as a personal computer, an engineering workstation, or the like The apparatus of FIG. 12 includes a computer 510, a display apparatus 520 connected to the computer 510, a communication apparatus 523, and an input apparatus. The input apparatus includes a keyboard 521 and a mouse 522. The computer 510 includes a CPU 511, a ROM 513, a secondary storage device 514 such as a hard disk, a removable-medium storage device 515, and an interface 516.

The keyboard 521 and mouse 522 provide user interface, and receive various commands for operating the computer 510 and user responses responding to data requests or the like. The display apparatus 520 displays the results of processing by the computer 510, and further displays various data that makes it possible for the user to communicate with the computer 510. The communication apparatus 523 provides for communication to be conduced with a remote site, and may include a modem, a network interface, or the like.

The scenario generating method according to the present invention is provided as a computer program executable by the computer 510. This computer program is stored in a memory medium M that is mountable to the removable-medium storage device 515. The computer program is loaded to the RAM 512 or to the secondary storage device 514 from the memory medium M through the removable-medium storage device 515. Alternatively, the computer program may be stored in a remote memory medium (not shown), and is loaded to the RAM 512 or to the secondary storage device 514 from the remote memory medium through the communication apparatus 523 and the interface 516.

Upon user instruction for program execution entered through the keyboard 521 and/or the mouse 522, the CPU 511 loads the program to the RAM 512 from the memory medium M, the remote memory medium, or the secondary storage device 514. The CPU 511 executes the program loaded to the RAM 512 by use of an available memory space of the RAM 512 as a work area, and continues processing while communicating with the user as such a need arises. The ROM 513 stores therein control programs for the purpose of controlling basic operations of the computer 510.

By executing the computer program as described above, the computer 510 performs the scenario generating method as described in the embodiments.

Further, the present invention is not limited to these embodiments, but various variations and modifications may be made without departing from the scope of the present invention.

What is claimed is:

1. A method of generating, by use of a computer, a scenario that is a series of operations for testing functions of an LSI, comprising:

extracting a plurality of operations of an LSI from a specification model of the LSI described in a predetermined descriptive language;

generating a plurality of operation descriptions, each of which describes relationships between input and output of a corresponding one of the operations and includes an operation name and a constraint condition;

generating at least one cause-effect graph that combines the operations based on the operation descriptions; and extracting, by using a processor, from the at least one cause-effect graph a scenario that is a series of operations for testing functions of the LSI, wherein the procedure of extracting a scenario extracts the series of operations by tracing back through the at least one cause-effect graph from a node that satisfies a condition required by a scenario constraint indicating a desired outcome, such that the series of operations lead to the desired outcome.

2. The method as claimed in claim 1, wherein the constraint condition includes a precondition that needs to be satisfied when an operation having the operation name starts and a postcondition that is supposed to be satisfied when the operation having the operation name comes to an end.

3. The method as claimed in claim 1, wherein the predetermined descriptive language is a UML, and the specification model at least includes a class diagram.

4. A method of generating, by use of a computer, a scenario that is a series of operations for testing functions of an LSI, comprising:

extracting a plurality of operations of an LSI from a specification model of the LSI described in a predetermined descriptive language;

generating a plurality of operation descriptions, each of which describes relationships between input and output of a corresponding one of the operations and includes an operation name and a constraint condition;

generating at least one cause-effect graph that combines the operations based on the operation descriptions; and extracting, by using a processor, from the at least one cause-effect graph a scenario that is a series of operations for testing functions of the LSI, wherein the step of generating a scenario includes:

generating a plurality of cause-effect graphs corresponding to the respective operation descriptions; and generating said at least one cause-effect graph by combining the plurality of cause-effect graphs together, wherein some of the cause-effect graphs include an operation name, a precondition, a constraint, and an outcome, and wherein if at least one of the operation name, precondition, constraint, and outcome of a first cause-effect graph matches at least one of the operation name, precondition, constraint, and outcome of a second cause-effect graph, the matched ones are shared to combine the first cause-effect graph and the second cause-effect graph.

5. The method as claimed in claim 4, wherein there are only six ways to combine the first cause-effect graph and the second cause-effect graph.

6. A computer-readable, non-transitory medium having a program embodied therein for causing a computer to generate a scenario, the program causing the computer to perform the steps of:

extracting a plurality of operations of an LSI from a specification model of the LSI that is written in a predetermined descriptive language;

generating a plurality of operation descriptions, each of which describes relationships between input and output of a corresponding one of the operations and includes an operation name and a constraint condition;

generating at least one cause-effect graph that combines the operations based on the operation descriptions; and extracting from the cause-effect graph a scenario that is a series of operations for testing functions of the LSI, wherein the procedure of extracting a scenario extracts the series of operations by tracing back through the at least one cause-effect graph from a node that satisfies a condition required by a scenario constraint indicating a desired outcome, such that the series of operations lead to the desired outcome.

7. The computer-readable, non-transitory medium as claimed in claim 6, wherein the constraint condition includes a precondition that needs to be satisfied when an operation having the operation name starts and a postcondition that is supposed to be satisfied when the operation having the operation name comes to an end.

8. An apparatus for generating a scenario, comprising:

a memory configured to store a program and a specification model of an LSI that is written in a predetermined descriptive language; and a processing unit configured to process the specification model stored in the memory by executing the program stored in the memory, wherein the processing unit performs:

extracting a plurality of operations of an LSI from the specification model;

generating a plurality of operation descriptions, each of which describes relationships between input and output of a corresponding one of the operations and includes an operation name and a constraint condition;

generating at least one cause-effect graph that combines the operations based on the operation descriptions; and extracting from the cause-effect graph a scenario that is a series of operations for testing functions of the LSI, wherein the procedure of extracting a scenario extracts the series of operations by tracing back through the at least one cause-effect graph from a node that satisfies a condition required by a scenario constraint indicating a desired outcome, such that the series of operations lead to the desired outcome.

9. The apparatus as claimed in claim 8, wherein the constraint condition includes a precondition that needs to be satisfied when an operation having the operation name starts and a postcondition that is supposed to be satisfied when the operation having the operation name comes to an end.

* * * * *